United States Patent …

(12) United States Patent
Kim et al.

(10) Patent No.: US 9,872,105 B2
(45) Date of Patent: Jan. 16, 2018

(54) HELMET EQUIPPED WITH SOUND SIGNAL PROCESSING UNIT AND SOUND SIGNAL PROCESSING APPARATUS

(71) Applicant: Borderless Incorporated, Tokyo (JP)

(72) Inventors: SuHyon Kim, Tokyo (JP); Arata Oono, Tokyo (JP)

(73) Assignee: Borderless Incorporated, Tokyo (JP)

( * ) Notice: Subject to any disclaimer, the term of this patent is extended or adjusted under 35 U.S.C. 154(b) by 0 days.

(21) Appl. No.: 15/347,682

(22) Filed: Nov. 9, 2016

(65) Prior Publication Data

US 2017/0332171 A1     Nov. 16, 2017

(30) Foreign Application Priority Data

May 13, 2016   (JP) ................................ 2016-096844

(51) Int. Cl.
*G10K 11/16*  (2006.01)
*H04R 3/04*   (2006.01)
*H03G 3/00*   (2006.01)

(52) U.S. Cl.
CPC ............ *H04R 3/04* (2013.01); *H03G 3/002* (2013.01); *H04R 2201/023* (2013.01); *H04R 2430/03* (2013.01)

(58) Field of Classification Search
CPC ....... G10L 21/0208; G10L 2021/02165; G10L 2021/02082; G10L 2021/02166; G10K 2210/1081; G10K 2210/3028; G10K 11/178; G10K 2210/108; G10K 11/002; G10K 11/1782; G10K 11/1784;

(Continued)

(56) References Cited

U.S. PATENT DOCUMENTS 4,409,435 A * 10/1983 Ono ..................... H04R 25/502
                                                             381/317
5,329,593 A *  7/1994 Lazzeroni ............... H04R 1/38
                                                             181/158

(Continued)

FOREIGN PATENT DOCUMENTS

JP   H08-113815 A   5/1996
JP   2003-108151 A  4/2003
JP   2005-163222 A  6/2005

OTHER PUBLICATIONS

Office Action issued in Japanese Patent Application No. 2016-1096844, dated Dec. 27, 2016, with English translation (6 pages).

*Primary Examiner* — Norman Yu
(74) *Attorney, Agent, or Firm* — Nakamishi IP Associates, LLC

(57) ABSTRACT

A speaker and a microphone are provided to a helmet main body. A phase of a sound signal passing through a high pass filter is controlled by a first phase control section, and is amplified by a first amplification section. A phase of a sound signal passing through the low pass filter is controlled by a second phase control section, and is amplified by a second amplification section. These sound signals are synthesized by a synthesis section. A drive section drives the speaker according to a synthesized sound signal. A control section switches phase inversion processing/non-inversion processing of the phase control sections and controls an amplification factor of the amplification sections based on sound power of the sound signal.

12 Claims, 11 Drawing Sheets

(58) Field of Classification Search
CPC ....... G10K 2210/3039; G10K 11/1786; G10K 2210/3026; G10K 2210/3044; G10K 11/346; G10K 2210/3045; G10K 2210/3213; H04R 1/1083; H04R 1/1008; H04R 3/005; H04R 1/406; H04R 5/04; H04R 2460/01; H04R 5/033; H04R 25/353; H04S 1/007; H04S 2400/01; H04S 7/30; H04S 1/005; H04S 7/307
USPC .... 381/71.1, 71.6, 92, 98, 71.11, 71.8, 94.1, 381/1, 122, 13, 300, 309, 312, 9, 7, 101, 381/103, 104, 106, 107, 123, 28, 317, 381/320, 370, 57, 83, 93, 94.5, 94.7, 381/94.8, 95, 96; 700/94

See application file for complete search history.

(56) References Cited

U.S. PATENT DOCUMENTS

| | | | |
|---|---|---|---|
| 2005/0117754 A1* | 6/2005 | Sakawaki | G10K 11/1782 381/71.6 |
| 2011/0038496 A1* | 2/2011 | Lott | H04R 5/033 381/309 |
| 2012/0140917 A1* | 6/2012 | Nicholson | G10K 11/1782 379/392.01 |
| 2013/0293723 A1* | 11/2013 | Benson | G02B 27/017 348/164 |

* cited by examiner

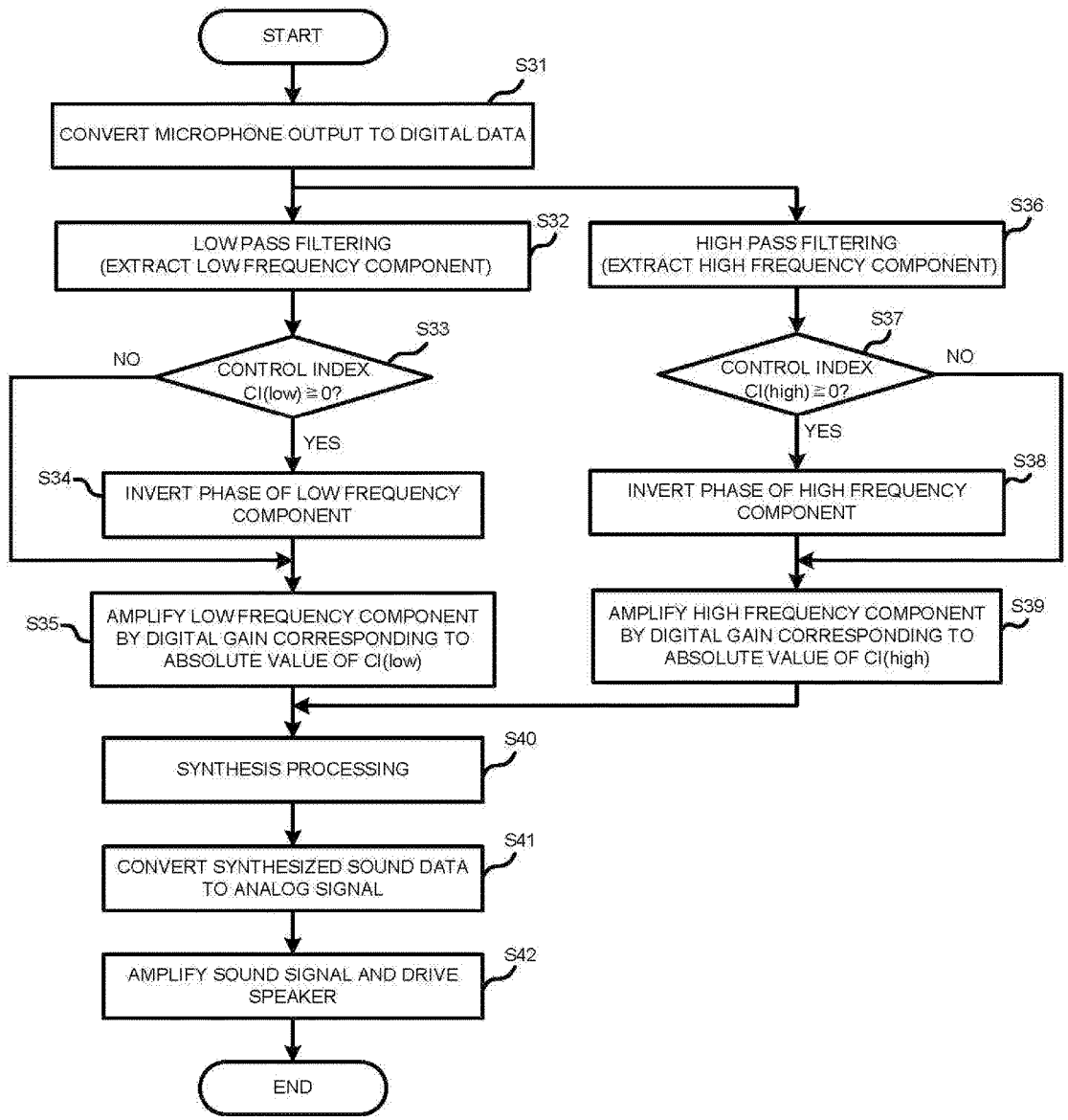

(LOW FREQUENCY COMPONENT)

(HIGH FREQUENCY COMPONENT)

HELMET EQUIPPED WITH SOUND SIGNAL PROCESSING UNIT AND SOUND SIGNAL PROCESSING APPARATUS

CROSS-REFERENCE TO RELATED APPLICATIONS

This application is based upon and claims the benefit of priority from the Japanese Patent Application No. 2016-096844, filed May 13, 2016 the entire contents of which are incorporated herein by reference.

FIELD

Embodiments described herein relate generally to a helmet equipped with a sound signal processing unit and a sound signal processing apparatus.

BACKGROUND

A helmet is being widely used in order to protect the head of an occupant of a motorcycle or a worker in a construction site. In most cases, in these environments, people are surrounded by various kinds of noise. For example, the occupant of the motorcycle is exposed under various types of noise environments such as engine noise, exhaust noise and road noise in a relatively high frequency band, and furthermore wind noise in a relatively low frequency band. For that reason, a helmet equipped with a system is proposed which collects an external sound such as noise from a microphone arranged nearby an ear of a user and generates a sound having a reverse phase to the external sound from a speaker to actively attenuate the external sound as exemplified in patent documents 1 and 2.

However, actually, the noise includes various frequency bands, a noise attenuation effect is effectively exerted for a target band, but the noise cannot be effectively attenuated in a band out of the target band.

Further, a situation that it is necessary for occupants of motorcycles or workers in the construction site communicate with each other with sound often occurs. For example, there is a case in which the occupant of the motorcycle converses with the occupant of the nearby motorcycle at the time of stopping at an intersection or at a parking lot. It is necessary to turn off the noise attenuation system each time, which is very troublesome. Furthermore, voice is in the relatively high frequency band, and since the most of the voice is absorbed by the shock absorbing layer of the helmet, the conversation across the helmet is very difficult.

PRIOR ART DOCUMENTS

Patent Documents (Patent Document 1) Japanese Patent Application KOKAI Publication No. 2005-163222
(Patent Document 2) Japanese Patent Application KOKAI Publication No. H08-113815

SUMMARY

The purpose is to provide a helmet equipped with a sound signal processing unit which can realize both noise attenuation and voice conversation support and a sound signal processing apparatus.

According to the present embodiment, a helmet comprises a helmet main body configured to cover the head of a wearer, a speaker arranged nearby an ear of the wearer and at the inside of the helmet main body, and a microphone arranged on the helmet main body. A high pass filter executes a high-pass processing on a sound signal of an external sound detected by the microphone. A low pass filter executes a low-pass processing on the sound signal. A first phase control section controls a phase of a sound signal subjected to the high-pass processing. A second phase control section controls a phase of a sound signal subjected to the low-pass processing. A first amplification section amplifies a sound signal subjected to phase control by the first phase control section. A second amplification section amplifies a sound signal subjected to phase control by the second phase control section. A synthesis section synthesizes the sound signals amplified by the first and second amplification sections to generate a synthesized sound signal. A drive section drives the speaker according to the synthesized sound signal. A control section controls the first and second phase control sections and the first and second amplification sections to switch phase inversion processing/non-inversion processing on the sound signal subjected to the high-pass processing, switch phase inversion processing/non-inversion processing on the sound signal subjected to the low-pass processing, and furthermore change an amplification factor for the sound signal subjected to the phase control by the first phase control section and change an amplification factor for the sound signal subjected to the phase control by the second phase control section according to sound power of a band of at least a part of the sound signal of the external sound.

BRIEF DESCRIPTION OF THE DRAWING

FIG. 9 is a flowchart illustrating procedures of the sound signal processing according to the control indexes in FIG. 6;

DETAILED DESCRIPTION

Hereinafter, a sound signal processing apparatus and a helmet equipped with the sound signal processing apparatus according to the present embodiment are described with reference to the accompanying drawings. The present embodiment is also applied to any one of a helmet worn by an occupant of a motorcycle on the head to protect the head, a helmet worn by a worker in a construction site on the head to protect the head, and a helmet worn on the head to protect the head in various other environments. Herein, the helmet worn by the occupant of the motorcycle is described. The occupant of the motorcycle is exposed under various types of noise environments such as engine noise, exhaust noise and road noise in a relatively high frequency band, and furthermore wind noise in a relatively low frequency band. On the other hand, a situation that the occupant of the motorcycle converses with the occupant of the nearby motorcycle across the helmet at the time of stopping at an intersection or at a parking lot also occurs. It can be said that these are conflicting situations from the point of view of sound attenuation.

The present embodiment suitably includes a sound attenuation function (noise reduction) which counteracts noise (external sounds) of such various bands by emitting a control sound having a reverse phase to the noise, that is, a cancel sound in this case from a speaker, and a sound enhancement function (boost function) which makes it easy to hear voice of a partner in conversation of occupants of motorcycles across helmets made at the time of stopping by emitting a control sound in phase with the voice, that is, an enhancement sound in this case from the speaker so as to support the voice conversation between the occupants (helmet-mounted motorcycles).

An electrical signal obtained by converting the noise and the voice with a microphone is called a "sound signal" in particular. The external sound refers to external noise and voice which is detected by a microphone 108 (109). The control sound refers to a sound emitted from the speaker and includes a reverse-phase sound (cancel sound) for counteracting the noise and an in-phase sound (boost sound) for enhancing the voice.

Figure 1:
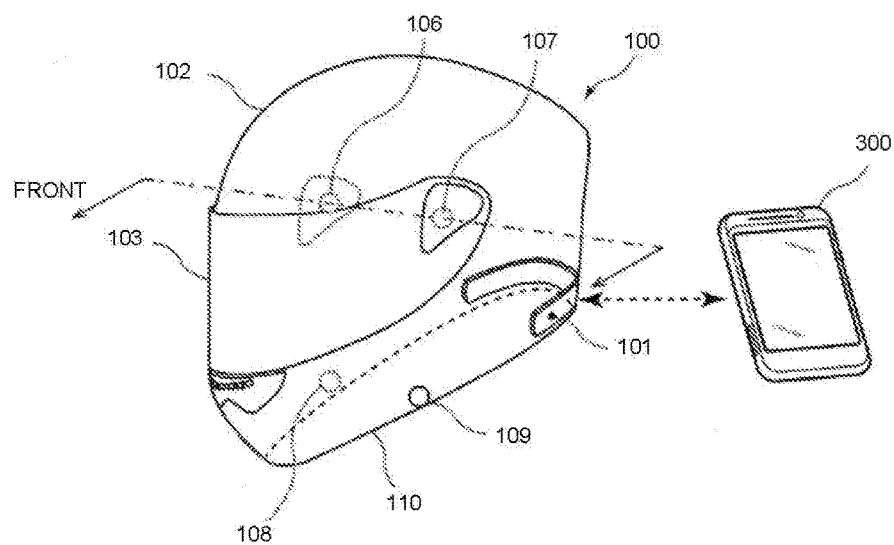
FIG. 1 is an external view of a helmet equipped with a sound signal processing apparatus according to an embodiment.

As shown in FIG. 1, a helmet 100 according to the present embodiment includes a helmet main body 102 which covers the head of a wearer and an openable/closable shield 103. The helmet main body 102 includes a hard shell (cap body), a shock absorbing liner which is made of a foam material and the like and mounted inside the shell, and a cushion installed inside the shock absorbing liner.

A sound signal processing apparatus is housed in the helmet main body 102. The sound signal processing apparatus includes an apparatus main body 101 for executing a sound signal processing, speakers 106 and 107 for right ear/for left ear installed in the vicinity of ears of the wearer and at the inside of the helmet main body 102, and the microphones 108 and 109 for right ear/for left ear arranged on the helmet main body 102. A battery (not shown) is built in the apparatus main body 101, or stored at another position of the inside of the helmet main body 102. The microphones 108 and 109 are located at lower parts of the respectively corresponding speakers 106 and 107, and arranged at a bottom edge 110 of the helmet main body 102 or at a position in the vicinity of the bottom edge 110, and more preferably, at the outside of the shell of the helmet main body 102. In general, the microphones 108 and 109 are arranged in the vicinity of the speakers 106 and 107 in the same sound field space; however, in the present embodiment, the microphones 108 and 109 are arranged at locations far from the speakers 106 and 107, that is, at the outside of the sound field space of the speakers 106 and 107. The arrangement of the microphones 108 and 109 and the speakers 106 and 107 generates time delay of about a few milliseconds to a few tens of microseconds from a moment the external sounds such as the voice and the noise such as the engine noise, the exhaust noise, the road noise and the wind noise are picked up by the microphones 108 and 109 to a moment the external sounds are transmitted via the shell, the shock absorbing liner and the cushion of the helmet main body 102 and reaches the ears of the wearer, and thus can reduce phase shift caused by time needed in a sound signal generation processing for the noise attenuation with the apparatus main body 101. Furthermore, the sound signal processing apparatus of the present embodiment includes a function for enhancing the voice of the partner to output the enhanced voice from the speakers 106 and 107 so as to support the conversation made between the occupants of the motorcycles across the helmets at the time of the stopping, and arranges the microphones 108 and 109 at the outside of the shell to excellently pick up the voice of the partner with the microphones 108 and 109.

Figure 2:
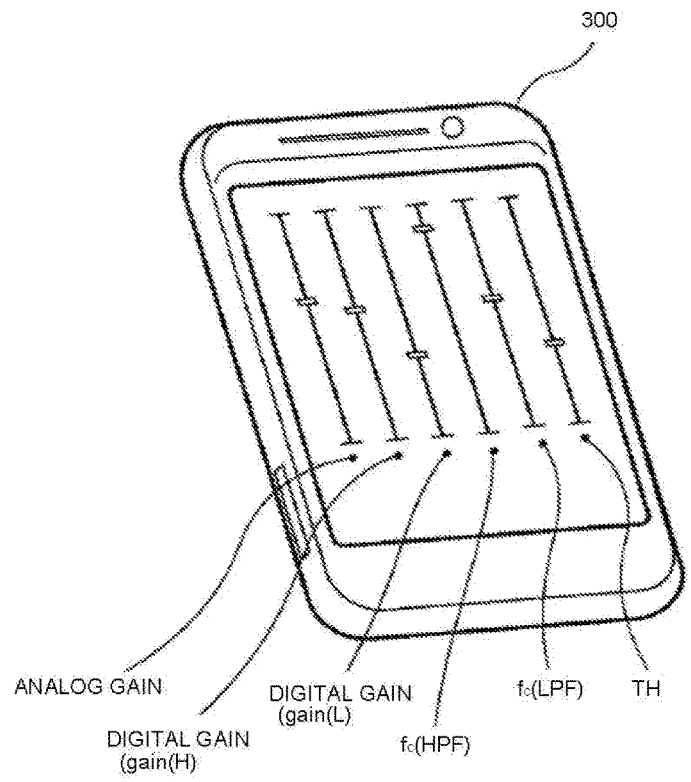
FIG. 2 is a diagram illustrating an example of an operation screen for a sound signal processing displayed on a display section of a multifunctional portable communication terminal in FIG. 1.

The apparatus main body 101 is bidirectionally connected with a portable information processing terminal 300 such as a smartphone through a near field communication standard as represented by Bluetooth (registered trademark). It is possible that an application program for executing a user setting operation of the sound signal processing apparatus according to the present embodiment is installed in the portable information processing terminal 300. FIG. 2 illustrates an example of an operation screen. A plurality of slider buttons is arranged on the operation screen of the portable information processing terminal 300. For example, a user (occupant or helmet wearer) can operate the sliders to randomly adjust analog gain (gain(comp.)) relating to volume of the control sounds emitted from the speakers 106 and 107, a digital gain (gain(H)) for a high frequency component, a digital gain (gain(L)) for a low frequency component, a cutoff frequency (fc(HPF)) of a high pass filter, a cutoff frequency (fc(LPF)) of a low pass filter, and a threshold value TH compared with sound power relating to frequency components of predetermined bands of sound signals detected by the microphones 108 and 109 for update of a control index relating to switch control of sound attenuation/sound enhancement.

Figure 3:
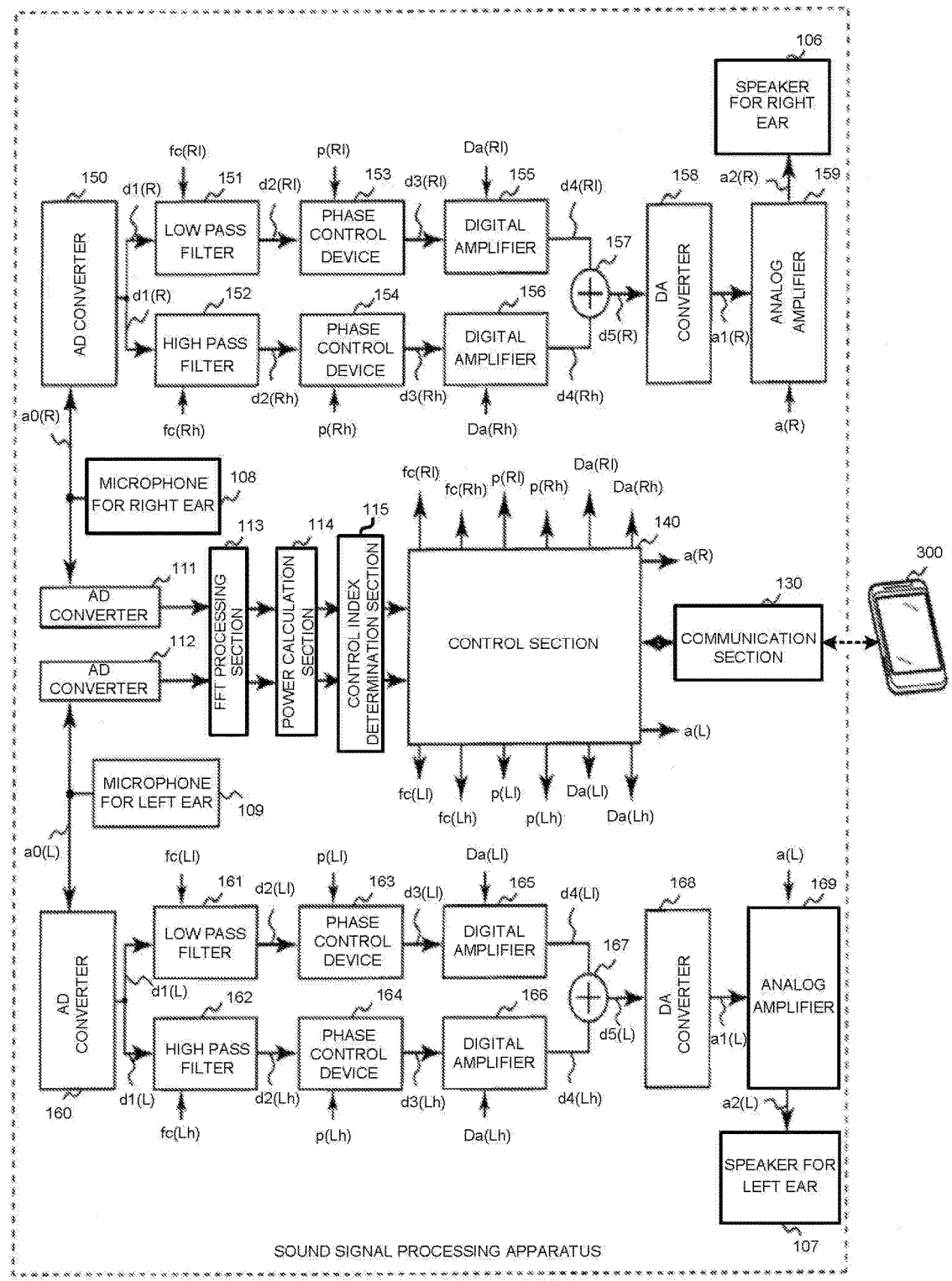
FIG. 3 is a block diagram illustrating the configuration of the sound signal processing apparatus according to the present embodiment.

FIG. 3 illustrates the configuration of the sound signal processing apparatus according to the present embodiment. The microphones 108 and 109 for right ear/for left ear convert the surrounding external sounds (air vibration) to electrical signals (referred to as sound signals) a0(R) and a0(L). Analog to digital converters 150 and 160 are respectively connected with the microphones 108 and 109 for right ear/for left ear. The analog to digital converters 150 and 160 respectively convert the sound signals a0(R) and a0(L) to digital sound signals d1(R) and d1(L) at respective sampling frequencies of, for example, 44.1 kHz. The digitized sound signal d1(R) for right ear and the digitized sound signal d1(L) for left ear each are used for a parallel processing in two digital sound signal processing systems. One digital sound signal processing system is a signal processing of which an object is the high frequency component of the sound signal, and the other digital sound signal processing system is a signal processing of which an object is the low frequency component of the sound signal. As the signal processing system for right ear and the signal processing system for left ear are equivalent in the configuration, the configuration of the signal processing system for right ear is described herein, and the description of the configuration of the signal processing system for left ear is omitted. However, the signs of the components of the signal processing system for left ear are recorded in parentheses.

Figure 4:
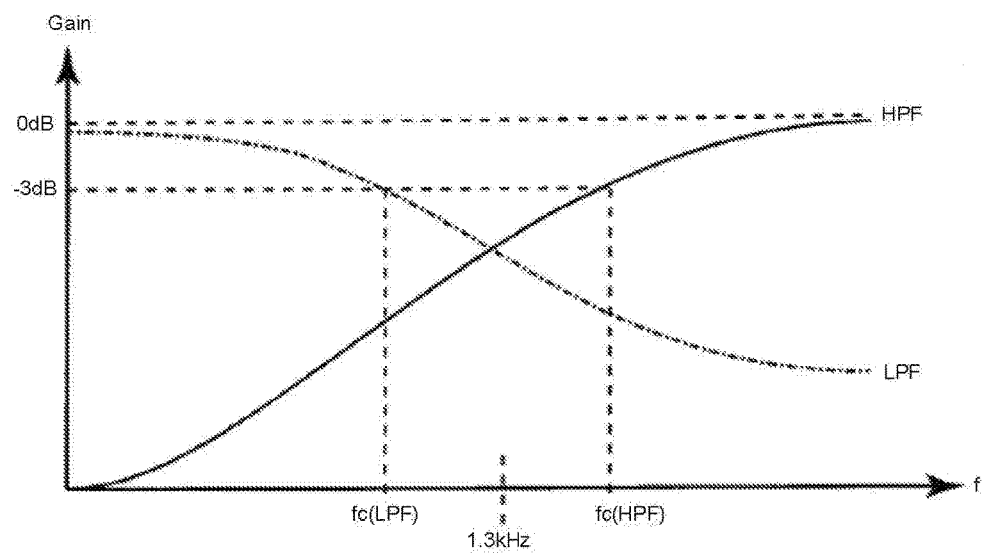
FIG. 4 is a diagram illustrating a typical example of filter characteristics of pass filter and a high pass filter in FIG. 3.
Figure 5:
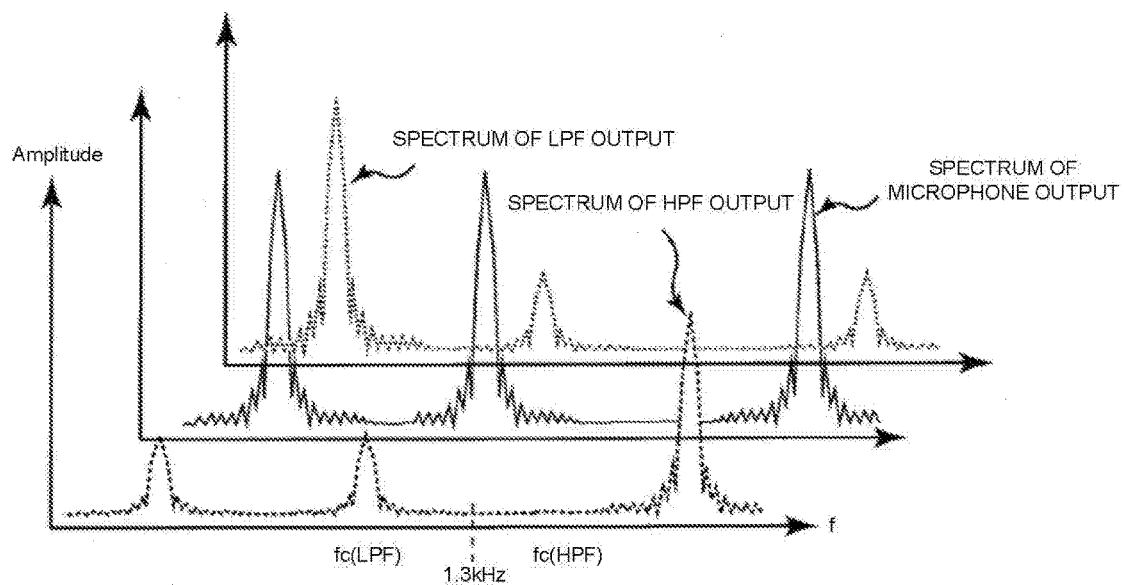
FIG. 5 is a diagram illustrating an example of each spectrum of output of a microphone, output of the low pass filter and output of the high pass filter in FIG. 3.

Output d1(R) (d1(L)) of the analog to digital converter 150 (160) is differentiated into two systems, and supplied to a low pass filter 151 (161) and a high pass filter 152 (162). FIG. 4 illustrates filter characteristics of the low pass filter 151 (161) and the high pass filter 152 (162). FIG. 5 illustrates a spectrum S(d1) of the output of the analog to digital converter 150 (160), a spectrum S(d2(low)) of the output of the low pass filter 151 (161), and a spectrum S(d2(high)) of the output of the high pass filter 152 (162).

A cutoff frequency fc(low) of the low pass filter 151 (161) is set to be lower than a predetermined value, preferably, 1.3 kHz, and a cutoff frequency fc(high) of the high pass filter 152 (162) is set to be higher than 1.3 kHz. The voice emitted by a human is within a frequency range of 0.2~4 kHz; however, conversation is sufficiently established in a band of 1.3 kHz or more. According to collected data of inventors, the frequency range of the wind noise is relatively low, and indicates 1.3 kHz or less. On the other hand, the frequency ranges of the engine noise, the exhaust noise and the road noise are relatively high and exceed 1.3 kHz, and the central bands thereof indicate, for example, 3 k~4 kHz. In this way, the wind noise mainly exists in the relatively low frequency band; on the other hand, the voice is included in the relatively high frequency band, and furthermore, the engine noise, the exhaust noise and the road noise as the noise are also included in the relatively high frequency band.

Further, the frequency bands of the noise such as the wind noise, the engine noise, the exhaust noise and the road noise change in response to vehicle type, engine type and grade and type of a helmet, and thus, in the present embodiment, it is possible that the cutoff frequency fc(low) of the low pass filter 151 (161) and the cutoff frequency fc(high) of the high pass filter 152 (162) each are adjusted randomly by the user. It is preferred to previously prepare a plurality of types of default values according to the vehicle type, the engine type and the grade and the type of the helmet and select a random default value. Furthermore, it is also possible that the cutoff frequency fc(low) of the low pass filter 151 (161) and the cutoff frequency fc(high) of the high pass filter 152 (162) each change dynamically according to variation of the sound power described later.

The low pass filter 151 (161) mainly extracts the frequency component of 1.3 kHz or less from the digital sound signals which are detected by the microphones 108 and 109 and converted by the analog to digital converter 150 (160). The high pass filter 152 (162) mainly extracts the high frequency component of 1.3 kHz or more from the digital sound signals which are detected by the microphones 108 and 109 and converted by the analog to digital converter 150 (160).

Phase control devices 153 (163) and 154 (164) are respectively connected with the output of the low pass filter 151 (161) and the output of the high pass filter 152 (162). The phase control device 153 (163) inverts a phase of a time waveform of a low frequency component d2(Rl) extracted by the low pass filter 151 (161) according to a phase control signal p(Rl) of a control section 140 or not. The phase inversion is realized by a sign inversion processing and a delay processing; however, the present invention is not limited to this. The other phase control device 154 (164) inverts a phase of a time waveform of a high frequency component d2(Rh) extracted by the high pass filter 152 (162) according to a phase control signal p(Rh) of the control section 140 or not. In this way, the phase control processing is separated according to the low frequency component and the high frequency component. Furthermore, digital amplifiers 155 (165) and 156 (166) are respectively connected with the output of the phase control devices 153 (163) and 154 (164). The digital amplifier 155 (165) amplifies a sound signal d3(Rl) of the low frequency component receiving the phase control by an amplification factor instructed by an amplification factor control signal Da(Rl) from the control section 140. Similarly, the digital amplifier 156 (166) amplifies a sound signal d3(Rh) of the high frequency component receiving the phase control by an amplification factor instructed by an amplification factor control signal Da(Rh) from the control section 140. Similar with the phase control, the amplification factor adjustment for the low frequency component and the amplification factor adjustment for the high frequency component are separated.

A digital to analog converter 158 is connected with the output of the digital amplifier 155 (165) and the output of the digital amplifier 156 (166) via a synthesizer 157. The synthesizer 157 synthesizes a sound signal d4(Rl) of the low frequency component amplified by the digital amplifier 155 (165) and a sound signal d4(Rh) of the high frequency component amplified by the digital amplifier 156 (166) to generate a synthesized sound signal d5(R). The digital to analog converter 158 converts the synthesized sound signal d5(R) to an analog sound signal a1(R). An analog amplifier 159(169) amplifies the sound signal a1(R) to generate a control sound from a speaker 106(107).

A sound signal a0(R) of the external sound such as the noise and the voice detected by the microphone 108 (109) is also supplied to an analog to digital converter 111 (112). The analog to digital converter 111 (112) converts the sound signal a0(R) to the digital sound signal at a predetermined sampling frequency. An analysis result of sound data collected by the inventors according to various types of motorcycles and various types of helmets indicates that the most of the external sound is equal to or smaller than 5 kHz. Thus, a sampling frequency of the analog to digital converter 111 (112) is preferably set to 10 kHz to cover the external sound of the band of 5 kHz or less.

An FFT processing section 113 respectively copies or decompresses the sound signal digitized by the analog to digital converter 111 at the right ear side and the sound signal digitized by the analog to digital converter 111 at the left ear side on a frequency space through the fast Fourier transform (FFT). The frequency conversion processing is not limited to FFT, and may also apply another processing such as the discrete cosine transform (DCT). A sound power calculation section 114 takes a predetermined band of the spectrum calculated by the FFT processing section 113, typically, 3 k~4 kHz serving as the central band of the frequency range of the engine noise, the exhaust noise and the road noise as a limit, and adds intensity of the frequency components contained in the band to calculate sound power separately for the left ear/right ear. The band changes in response to the type of the helmet, and it is preferred that a plurality of bands in the sound power calculation section 114 is previously prepared and the user can operate the portable information processing terminal 300 connected with the control section 140 of the apparatus main body 101 via a communication section 130 to randomly select a band.

The foregoing arrangement positions of the microphones 108 and 109 realize the detection of the noise such as the wind noise, the engine noise, the exhaust noise and the road noise and furthermore voice of another person. The sound and furthermore the noise such as the engine noise, the exhaust noise and the road noise are included in the relatively high frequency band, and if the sound attenuation function is often applied to the relatively high frequency band, the noise and the voice are also attenuated, and the voice conversation becomes difficult. On the other hand, if the sound enhancement function for emitting a sound wave in phase with the external sound such as the voice is exerted without applying the sound attenuation function to the high frequency band in order to make it possible to make the voice conversation, the occupant is exposed under the noise environment such as the engine noise, the exhaust noise and the road noise.

The present embodiment solves the problem of this trade off. The situation that the voice conversation is generated and the situation that the noise such as the engine noise, the exhaust noise and the road noise is generated strongly are distinguished, and the sound attenuation function and the sound enhancement function are switched dynamically for each low frequency band/high frequency band. Furthermore, the sound enhancement function is exerted more strongly in the high frequency band than in the low frequency band. Through the switch control and the sound enhancement level control, the noise is properly attenuated, and natural voice conversation of occupants who do not shout at each other is also realized. As stated above, the microphones 108 and 109 can realize the voice conversation by being arranged at the outside of the shell of the helmet main body 102; however, on the other hand, the wind noise is detected during travelling, but the sound attenuation function is applied during travelling, and thus, the occupant is not exposed in the unpleasant noise of the wind noise.

In this way, in the present embodiment, in addition to the sound attenuation function, the sound enhancement function is included. In the present embodiment, "a control index CI(high) relating to the high frequency component and a control index CI(low) relating to the low frequency component" are introduced as indexes for executing control for switching the sound attenuation function and the sound enhancement function and furthermore executing control for adjusting an attenuation degree/enhancement degree.

A control index determination section 115 determines the control index CI(high) relating to the high frequency component and the control index CI(low) relating to the low frequency component based on the sound power typically in the band of 3 k~4 kHz calculated by the sound power calculation section 114. In relation to the right ear side, the control section 140 controls the phase control section 153 to switch the inversion/non-inversion of the phase of the sound signal mainly including the low frequency component according to the control index CI(low). The control section 140 controls the phase control section 154 to switch the inversion/non-inversion of the phase of the sound signal mainly including the high frequency component according to the control index CI(high), which is separated from the switch control of the inversion/non-inversion of the phase of the sound signal mainly including the low frequency component. The phase control at the left ear side is similar with that at the right ear side, and the control section 140 controls the phase control sections 163 and 164 to switch phase inversion and phase non-inversion individually in response to each control index with respect to the low frequency component/high frequency component.

In relation to the right ear side, the control section 140 controls the digital amplifier 155 to change an amplification factor (digital gain) to the sound signal mainly including the low frequency component according to the control index CI(low) within a range from 0 to a predetermined value. The control section 140 controls the digital amplifier 156 to change an amplification factor (digital gain) to the sound signal mainly including the high frequency component according to the control index CI(high) within a range from 0 to a predetermined value, which is separated from the control of the amplification factor to the sound signal mainly including the low frequency component. Similarly, the control section 140 controls the amplification factors within the ranges from 0 to the predetermined values individually for the digital amplifiers 165 and 166 in response to the sound power at the left ear side. For example, the digital gain is adjusted within a range of 0~+20 dB at the time of the sound attenuation, and the digital gain is adjusted within a range of 0~+5 dB at the time of the sound enhancement.

When the phase of the sound signal is inverted (reverse phase) and the amplification factor is set to an upper limit value, the external sound is counteracted through the sound wave and thus the greatest sound attenuation effect is exerted. When the phase of the sound signal is not inverted (in phase) and the amplification factor is set to the upper limit value, the external sound is synthesized with the sound wave and thus the greatest sound enhancement (boost) effect is exerted. In the present embodiment, the switches of the sound attenuation function and the sound enhancement function are separately controlled according to the high frequency component and the low frequency component. As stated above, the sound power takes the frequency component of 3 k to 4 kHz serving as the central band of the noise such as the engine noise, the exhaust noise and the road noise as the object, and thus tends to indicate a high value at the time of speed-up or during high-speed travelling and to indicate a low value at the time of the stopping or during low-speed travelling. Thus, the switch of the sound attenuation function/the sound enhancement function is controlled according to the control indexes CI(low) and CI(high) so as to execute the sound attenuation function when the sound power indicates a relatively high value and to exert the sound enhancement (boost) function when the sound power indicates a relatively low value.

Figure 6:
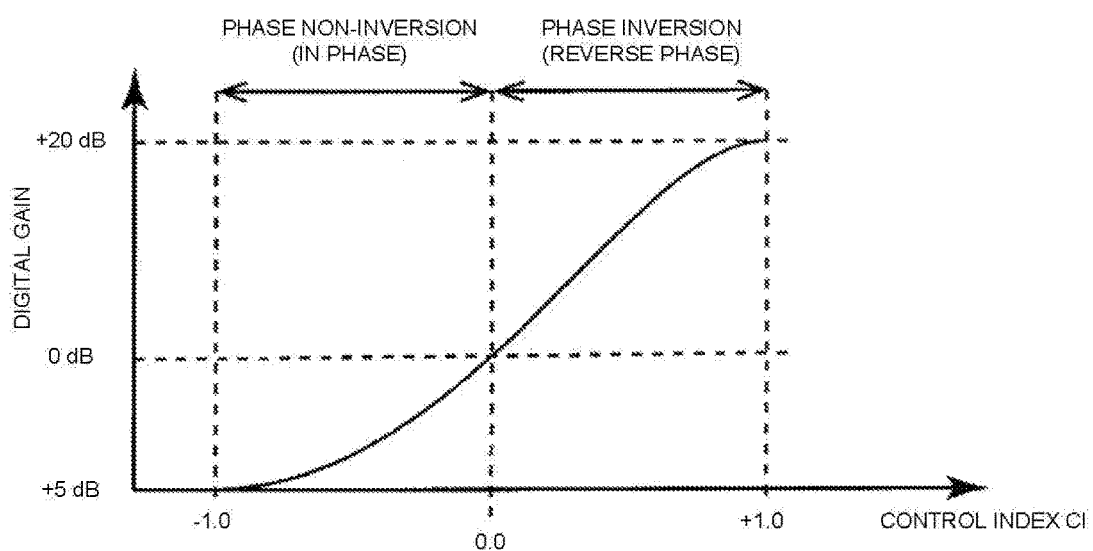
FIG. 6 is a diagram illustrating a relationship of phase inversion/non-inversion and a digital gain to control indexes determined by a control index determination section in FIG. 3.

FIG. 6 illustrates a relationship of the phase inversion/non-inversion and the digital gain to the control indexes CI(low) and CI(high). The control index CI(high) relating to the high frequency component and the control index CI(low) relating to the low frequency component mainly change within a range from "−1" to "+1" typically. When these control indexes CI are smaller than the predetermined value, in other words, herein, when the predetermined value is set to zero value and these control indexes CI are smaller than the zero value (negative), the control section 140 exerts the sound enhancement (boost) effect without carrying out the phase inversion (in phase); when these control indexes CI are equal to or greater than the predetermined value, in other words, herein, when these control indexes CI are the zero value or a value higher than the zero value (positive), the control section 140 inverts the phase and exerts the sound attenuation effect. Further, the control section 140 adjusts the amplification factors of the digital amplifiers 155, 156, 165 and 166 according to an absolute value of a difference between the control index CI and the predetermined value, in other words, herein, the absolute value of the control index CI by setting the predetermined value to the zero. When the control index CI is the zero value, the amplification factor is set to 0 dB (equal-magnification), and the amplification factor is increased as the absolute value of the control index CI becomes large. For example, the amplification factor is increased as the control index CI is close to "+1 (maximum attenuation)", and the maximum of the amplification factor is set to, for example, +20 dB; the amplification factor is increased as the control index CI is close to "−1 (maximum enhancement)", and the upper limit value is set to, for example, +5 dB which is smaller than the upper limit value at the time of the attenuation. When the control index CI is "−1", the greatest sound enhancement (boost) effect is exerted through the phase non-inversion and the maximum amplification factor (+5 dB), and when the control index CI is "+1", the greatest sound attenuation effect is exerted through the phase inversion and the maximum amplification factor (+20 dB).

Figure 7:
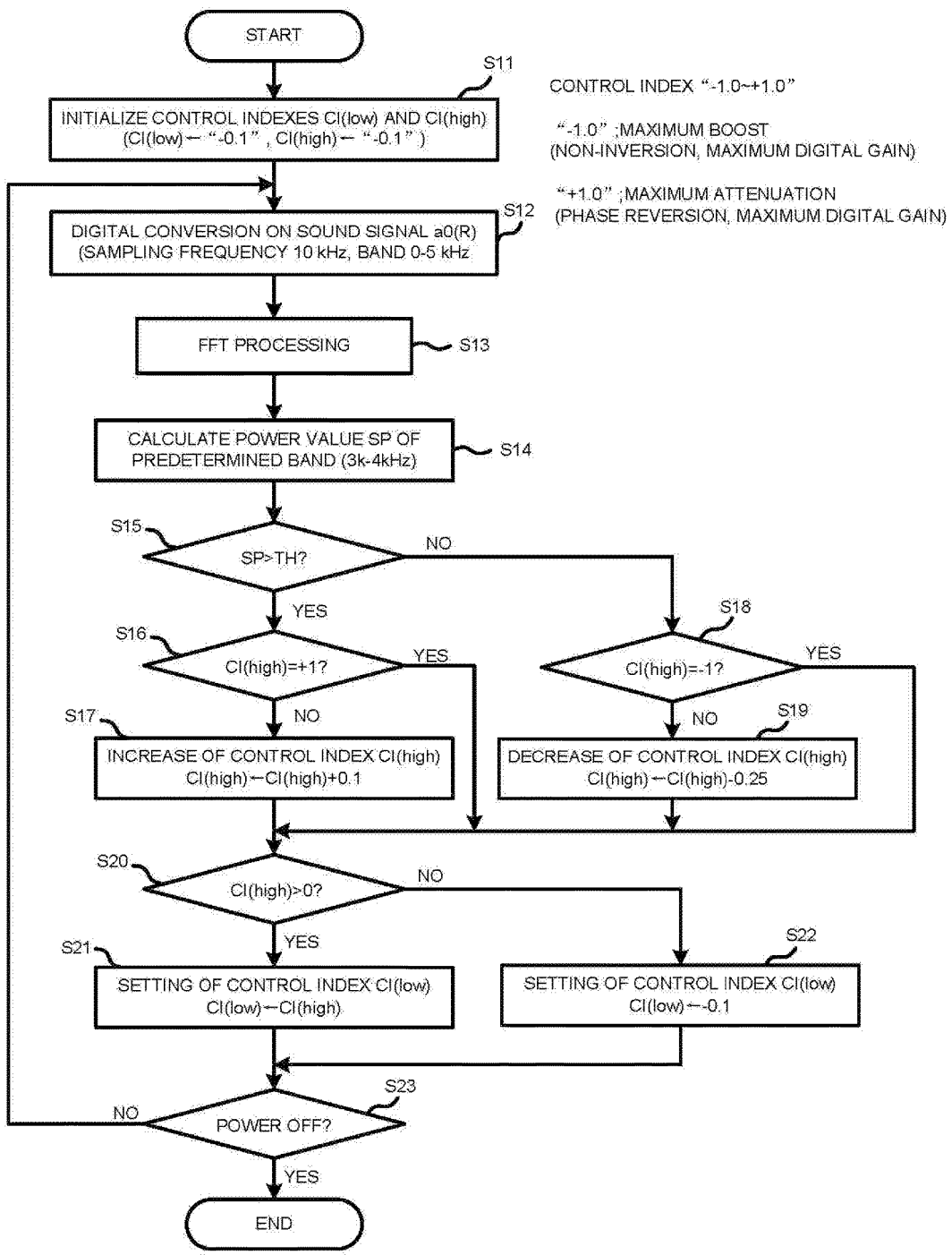
FIG. 7 is a flowchart illustrating an update processing procedure of the control indexes used in the sound signal processing according to the present embodiment.
Figure 8:
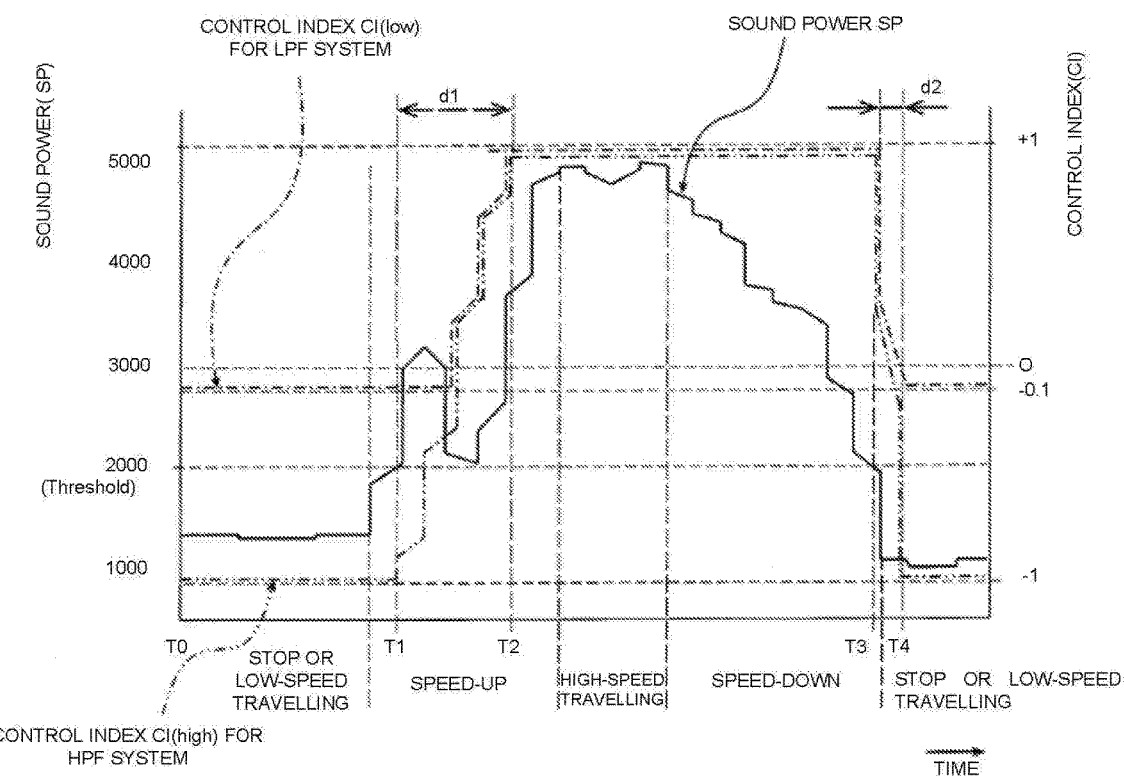
FIG. 8 is a time chart illustrating time change of the control indexes to time variation of sound power based on the procedure in FIG. 7.

FIG. 7 illustrates an update processing procedure of the control index CI(low) for the sound signal processing for the low frequency component and the control index CI(high) for the sound signal processing for the high frequency component by the control index determination section 115. FIG. 8 illustrates time change of the control indexes CI(low) and CI(high) to time variation of the sound power (SP) based on the procedure in FIG. 7. As the processing is equivalent at the right ear side and at the left ear side, the processing procedure at the right ear side is described herein, and the processing procedure at the left ear side is omitted.

The control indexes CI(low) and CI(high) are changed within the range from "−1" to "+1" by the control section 140 in response to the sound power of the high frequency band (3 k~4 kHz) including the engine noise, the exhaust noise and the road noise. As stated above, when the control indexes CI(low) and CI(high) are equal to or smaller than the predetermined value, that is, the zero value or the negative herein, the phase is not inverted, and the sound enhancement function is exerted at the strength corresponding to the digital gain at this time. When the control indexes CI(low) and CI(high) are greater than the predetermined value, that is, the positive herein, the phase is inverted, and the sound attenuation function is exerted at the strength corresponding to the digital gain at this time.

Firstly, power supply is turned on, and the control index CI(low) and the control index CI(high) are respectively set to initial values by the control section 140 (Step S11). Typically, the control index CI(low) is initialized to "−0.1" under which the weak sound enhancement effect is exerted, and the control index CI(high) is initialized to "−1.0" under which the greatest sound enhancement effect is exerted. The respective initial values of the control index CI(low) and the control index CI(high) are changeable.

The sound signal a0(R) of the microphone 108 is converted to the digital sound signal at the predetermined sampling frequency (10 kHz) through the analog to digital converter 111 (Step S12). As the most of the noise is equal to or smaller than 5 kHz, noise component can be detected almost without omission. The sound signal digitized by the analog to digital converter 111 is copied or decompressed on the frequency space by the FFT processing section 113 (Step S13). The intensity of the frequency components contained in a whole band, or a partial band, and preferably, 3 k~4 kHz serving as the central bands of the engine noise, the exhaust noise and the road noise is added by the sound power calculation section 114, and sound power SP is calculated (Step S14). The sound power SP is compared with a predetermined threshold value TH in the control index determination section 115 (Step S15). When the sound power SP exceeds the threshold value TH (YES in Step S15), and the control index CI(high) relating to the high frequency component does not reach a maximum value "+1" (NO in Step S16), the control index determination section 115 adds, for example, 0.1 to the control index CI(high) as a predetermined increment ΔIhigh (Step S17). When the sound power SP exceeds the threshold value TH (YES in Step S15), and the control index CI(high) relating to the high frequency component reaches the maximum value "+1" (YES in Step S16), the control index determination section 115 maintains the control index CI(high) to the maximum value "+1".

When the sound power SP is equal to or smaller than the threshold value TH (NO in Step S15), and the control index CI(high) relating to the high frequency component does not reach a minimum value "−1" (NO in Step S18), the control index determination section 115 subtracts, for example, 0.25 from the control index CI(high) as a predetermined decrement ΔDhigh which is set to be higher than the increment ΔIhigh (Step S19). When the sound power SP is equal to or smaller than the threshold value TH (NO in Step S15), and the control index CI(high) relating to the high frequency component reaches the minimum value "−1" (YES in Step S18), the control index determination section 115 maintains the control index CI(high) to the minimum value "−1".

By setting the increment ΔIhigh and slowly increasing the control index CI(high) as stated above, the greatest sound attenuation effect is not exerted immediately after the sound power SP exceeds the threshold value TH, but transition of a natural sound signal processing is realized gradually in which a certain degree of delay time d1 is applied from time at which the noise is increased and the sound power SP initially exceeds the threshold value TH to time at which the control indexes CI(low) and CI(high) reach the upper limit value and the greatest sound attenuation effect is exerted, and thus the sound enhancement function is slowly weakened and switched to the sound attenuation function at a certain time, and then the sound attenuation effect is slowly increased.

Further, as the decrement ΔDhigh is set to the higher value than the increment ΔIhigh in increasing process of noise, delay time d2 from time at which the noise is reduced and the sound power SP initially reaches the threshold value TH to time at which the control index CI(high) reaches the initial value (lower limit value) and the greatest sound enhancement effect is exerted can become shorter time than the delay time d1 until the control index CI(high) reaches the upper limit value (+1) in the increasing process of noise. Thus, conversion is possible in a short time from a situation that the external sound is attenuated to a state in which the external sound is enhanced and audible. Surrounding situations are grasped from the sense of sight and the sense of hearing when the motorcycle is decelerated and stopped; however, through the conversion from the sound attenuation state to the sound enhancement state in a short time, it is possible to grasp the situations from the sense of sight and the sense of hearing at an early stage, and improvement of security is realized.

The delay time d1 is a random adjustment item which is determined according to the initial value of the control index CI(high) and the increment ΔIhigh, and similarly, the delay time d2 is a random adjustment item which is determined according to the initial value of the control index CI(high) and the decrement ΔDhigh.

In the following Step S20, the control index determination section 115 determines whether or not the control index CI(high) exceeds the predetermined value, that is, herein, the zero value. When the control index CI(high) exceeds the zero value (YES in Step S20), the control index determination section 115 sets the value of the control index CI(low) relating to the low frequency component to the same value as the control index CI(high) (Step S21). In other words, when the sound attenuation function is exerted at a certain attenuation level for the high frequency component, similarly, the sound attenuation function is also exerted at the same attenuation level for the low frequency component.

When the control index CI(high) is equal to or smaller than the zero value (NO in Step S20), the control index determination section 115 sets the value of the control index CI(low) relating to the low frequency component to the initial value "−0.1" (Step S22). In other words, when the sound enhancement function is exerted for the high frequency component, though an enhancement level (digital gain) is low, the sound enhancement function is also exerted for the low frequency component.

The loop of the foregoing processing in steps S12-S22 is repeated at a certain control cycle until the power supply of the sound signal processing apparatus is turned off (Step S23).

As shown in FIG. 9, the control section 140 executes the sound signal processing separately for the high frequency component/low frequency component according to the control index. This processing is repeated at a certain control cycle during a period when the power supply of the sound signal processing apparatus is turned on. The sound signals a0(R) and a0(L) of the external sound detected by the microphones 108 and 109 are converted to the digital sound signals d1(R) and d1(L) respectively by the analog to digital converters 150 and 160 (Step S31). The digitized sound signal d1(R) for right ear is supplied to the low pass filter 151 and the high pass filter 152, and the low frequency component d2(Rl) and the high frequency component d2(Rh) are extracted (Step S32). Similarly, the digitized sound signal d1(L) for left ear is supplied to the low pass filter 161 and the high pass filter 162, and a low frequency component d2(Ll) and a high frequency component d2(Lh) are extracted (Step S36).

When the control index CI(low) relating to the low frequency component is equal to or greater than the predetermined value, that is, herein, the zero value (zero or positive) (YES in Step S33), the control signal p(Rl) for instructing the inversion of the phase is supplied from the control section 140 to the phase control section 153. Thus, the phase control section 153 inverts the phase of the sound signal d2(Rl) of the low frequency component (Step S34). For example, polarity is inverted. On the other hand, when the control index CI(low) is smaller than the zero value (negative) (NO in Step S33), the control signal p(Rl) for instructing the non-inversion of the phase is supplied from the control section 140 to the phase control section 153, and the sound signal d2(Rl) of the low frequency component is maintained in phase by the phase control section 153.

Next, the control section 140 determines the amplification factor according to the absolute value of the difference between the control index CI(low) and the predetermined value, that is, herein, the absolute value of the control index CI(low) by setting the predetermined value to the zero. The amplification factor is increased as the control index CI(low) is close to "−1", and set to "+5 dB" when the control index CI(low) is "−1". The amplification factor is increased as the control index CI(low) is close to "+1", and set to "+20 dB" when the control index CI(low) is "+1". With the determined amplification factor, the low frequency component d3(Rl) receiving the phase control is amplified by the digital amplifier 155 (Step S35).

Similarly, for the high frequency component, when the control index CI(high) relating to the high frequency component is equal to or greater than the predetermined value, that is, herein, the zero value or positive (YES in Step S37), the control signal p(Rh) for instructing the inversion of the phase is supplied from the control section 140 to the phase control section 154. Thus, the phase of the sound signal d2(Rh) of the high frequency component is inverted by the phase control section 154 (Step S38). On the other hand, when the control index CI(high) is smaller than the zero value (negative) (NO in Step S37), the control signal p(Rh) for instructing the non-inversion of the phase is supplied from the control section 140 to the phase control section 154, and the sound signal d2(Rh) of the high frequency component is maintained in phase by the phase control section 154.

Further, the control section 140 determines the amplification factor according to the absolute value of the control index CI(high). The amplification factor is increased by setting "+5 dB" as the upper limit value as the control index CI(high) is close to "−1 (maximum enhancement)", and is increased by setting "+20 dB" as the upper limit value as the control index CI(high) is close to "+1 (maximum attenuation)". With the determined amplification factor, the high frequency component d3(Rh) receiving the phase control is amplified by the digital amplifier 156 (Step S39).

The low frequency component d4(Rl) amplified by the digital amplifier 155 and the high frequency component d4(Rh) amplified by the digital amplifier 156 are synthesized by the synthesizer 157 (Step S40). The synthesized sound signal d5(R) is converted to the analog sound signal a1(R) by the digital to analog converter 158 (Step S41). The analog amplifier 159 amplifies the sound signal a1(R), and drives the speaker 106 (Step S42). Thus, the vibration plate of the speaker 106 is vibrated, and the control sound is generated from the speaker 106. When the control sound is in phase with the external sound, the external sound is enhanced, and when the phase of the control sound is reverse to that of the external sound, the external sound is attenuated.

Furthermore, similarly, a sound signal a1(L) is also generated in the signal processing systems 160-169 at the left ear side according to control indexes CI(low) and CI(high) for left ear.

Next, the state transition of the sound attenuation/enhancement by the sound signal processing as stated above is described depending on transition of the actual travelling state of the motorcycle. As shown in FIG. 8, it is assumed that the state of the motorcycle transits in each state of stop, speed-up, high-speed travelling (constant speed travelling), speed-down and stop. During the stop period, certainly, there is no road noise, the rotation number of the engine is low, and the exhaust noise is also small, and thus the sound power SP is equal to or smaller than the threshold value TH. The situation at the low-speed travelling is similar, and the sound power SP is equal to or smaller than the threshold value TH.

Figure 10A:
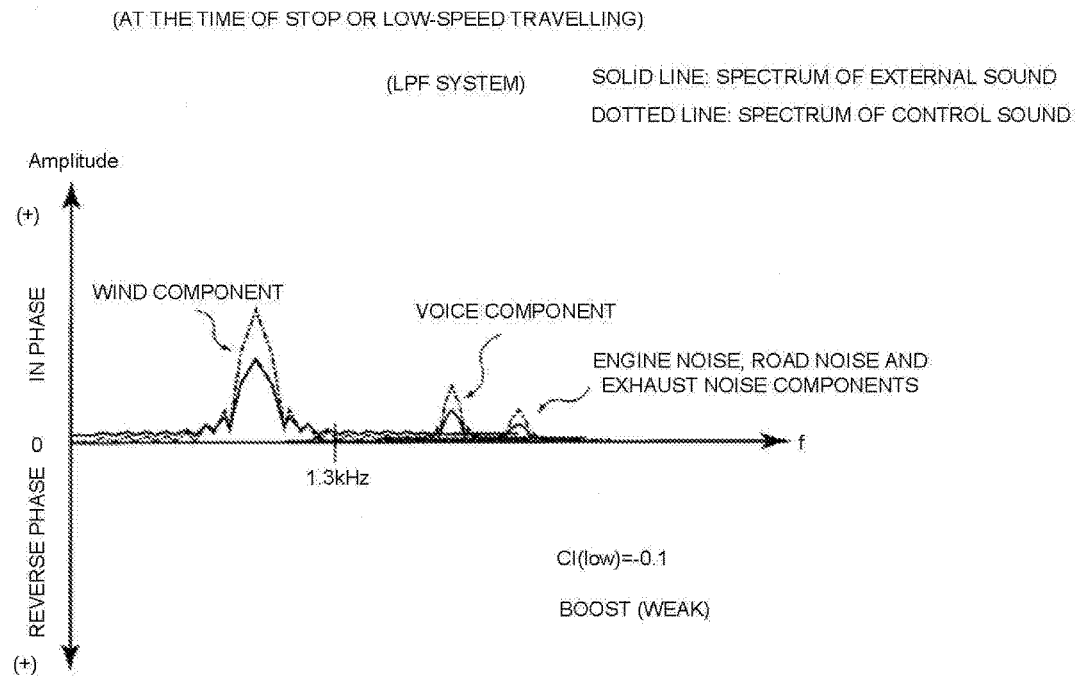
FIGS. 10A and 10B are a diagram illustrating an example of spectrums of output of digital amplifiers of two systems when the control indexes are minimum values (−0.1 and −1.0) according to the present embodiment.

During a period when the motorcycle is stopped or travels at the low speed, the control index CI(low) relating to the low frequency component indicates the initial value "−0.1". As exemplified in FIG. 10A, the sound signal (dotted line) focusing on the engine noise and the like and the voice attenuated by the low pass filters 151 and 161 is weakly amplified in phase and emitted from the speakers 106 and 107 as the control sound (enhancement sound or boost sound). The external sound (solid line) of the engine noise and the like and the voice is weakly enhanced by the control sound (enhancement sound) emitted from the speakers 106 and 107.

Figure 10B:
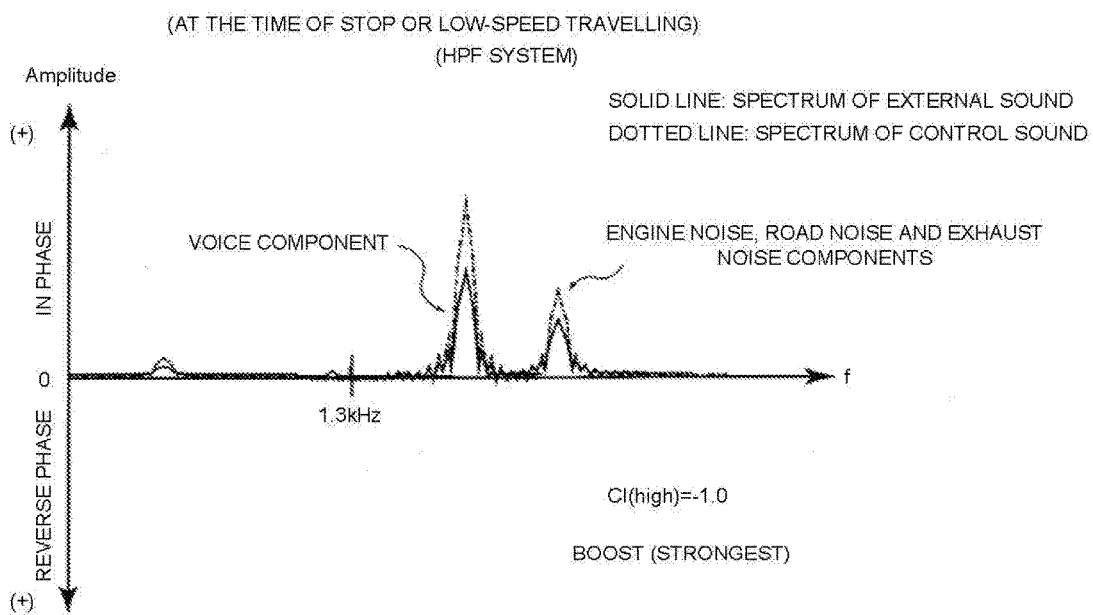

During this period, the control index CI(high) relating to the high frequency component indicates the initial value "−1.0". The sound signal focusing on the engine noise and the like and the voice passing through the high pass filters 152 and 162 is amplified by the maximum amplification factor in phase as exemplified in FIG. 10B. The external sound (solid line) of the engine noise and the like and the voice is maximally enhanced by the control sound emitted from the speakers 106 and 107. During the stop period, the engine noise and the exhaust noise become small certainly, and even if the engine noise and the exhaust noise are enhanced, audibility of voice is hardly inhibited, and thus, the conversation can be realized under the same environment as the natural conversation in a situation that the helmet is not worn but not the conversation like shout across the helmet. Further, the engine noise and the like of other motorcycles in the vicinity can also be enhanced and caught, and it is possible to grasp a vicinal sound field situation.

Then, the rotation number of the engine is slowly increased, and meanwhile a clutch is connected and the travelling is started. At this stage, the sound power SP rises. However, the control indexes CI(low) and CI(high) both are maintained at the initial values, and the initial sound enhancement operation state is maintained until the sound power SP reaches the threshold value TH. Thus, while the travelling is started and the speed of the travelling is low, it is possible to continue a state capable of grasping the vicinal sound field situation under the sound enhancement environment without attenuating the sound.

After the speed-up is started, the rotation number of the engine rises, and though the rotation number falls temporarily with shift up of a gear and the sound power SP is also reduced temporarily, the sound power SP does not become equal to or smaller than the threshold value TH and indicates a rising trend in general. The control index CI(high) is added with the increment ΔIhigh at time T1 at which the sound power SP reaches the threshold value TH. While the sound power SP exceeds the threshold value TH, the control index CI(high) is repeatedly incremented by the increment ΔIhigh and thus slowly rises. In this way, the digital gain is decreased, and the sound enhancement effect is slowly reduced. On the other hand, while the control index CI(high) relating to the high frequency component is the negative, the control index CI(low) relating to the low frequency component is maintained at the initial value, and the weak enhancement effect is exerted continuously (Step S22 in FIG. 7).

When the control index CI(high) relating to the high frequency component is converted to the zero value or more, the state is transited from the sound enhancement state to the sound attenuation state. In synchronization with the transition, the state is also transited from the sound enhancement state to the sound attenuation state regarding the low frequency component. The amplification factors of the digital amplifiers 155, 156, 165 and 166 are increased depending on the rise of the absolute values of the control indexes CI(low) and CI(high), and accordingly, the sound attenuation effect is raised, and thus the wind noise, the engine noise, the exhaust noise and the road noise along with the speed-up are slowly attenuated against the actual intensity rise.

Figure 11A:
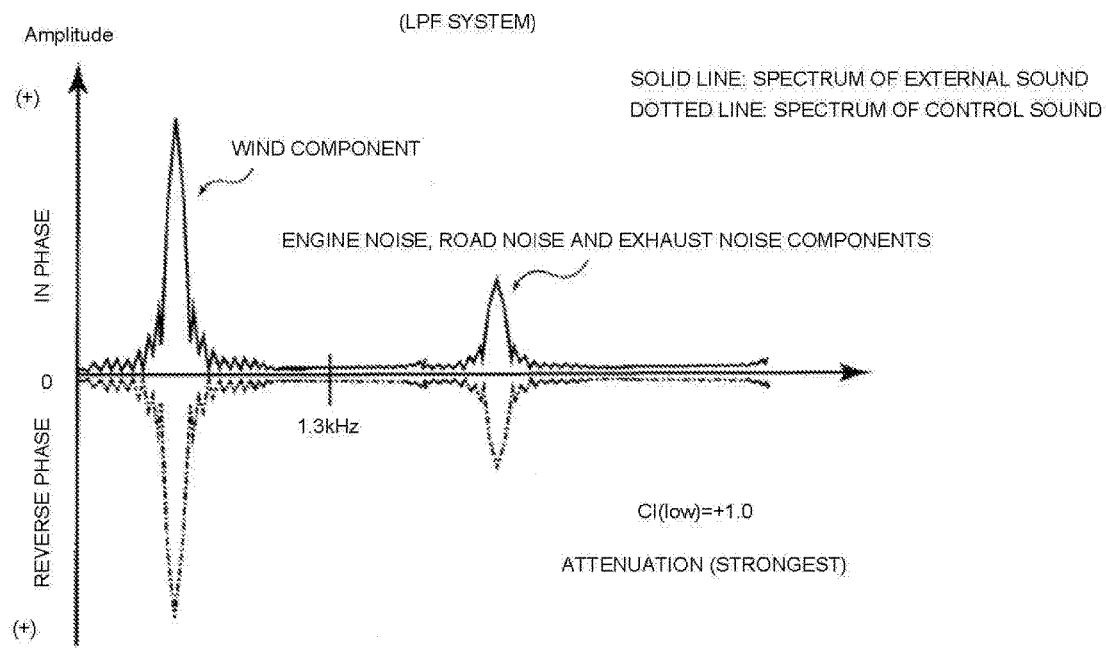
FIGS. 11A and 11B are a diagram illustrating an example of spectrums of output of the digital amplifiers of the two systems when the control indexes are a maximum value (+1) according to the present embodiment.
Figure 11B:
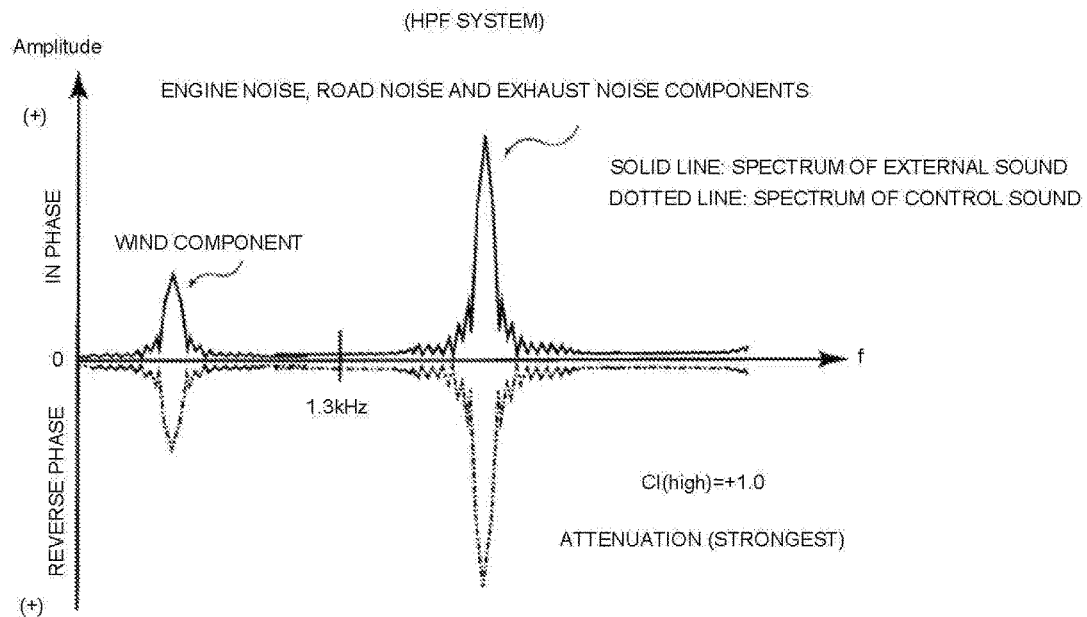
Figure 12A:
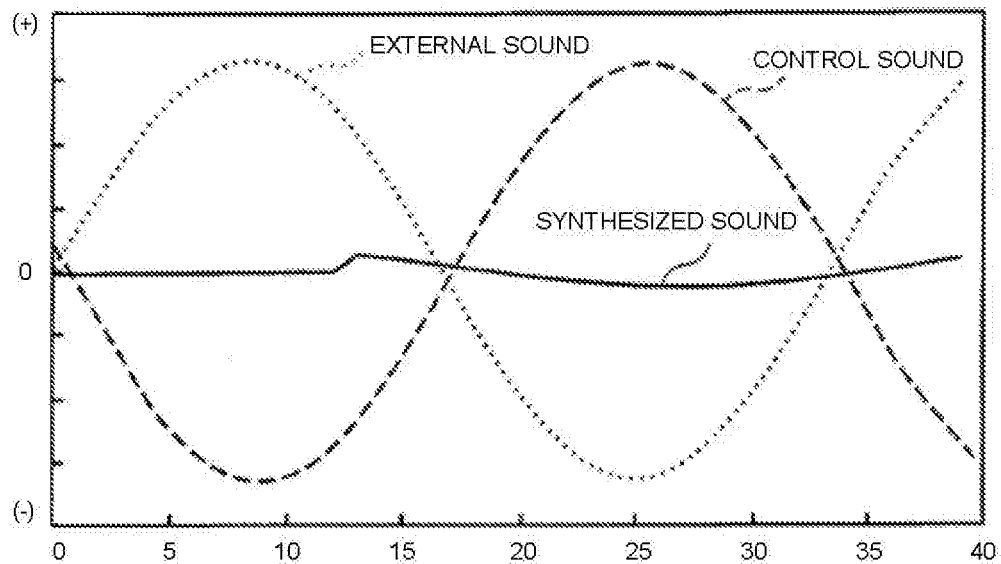
FIGS. 12A and 12B are a diagram illustrating an example of a time waveform of each of a low frequency component and a high frequency component attenuated through the sound signal processing according to the present embodiment.
Figure 12B:
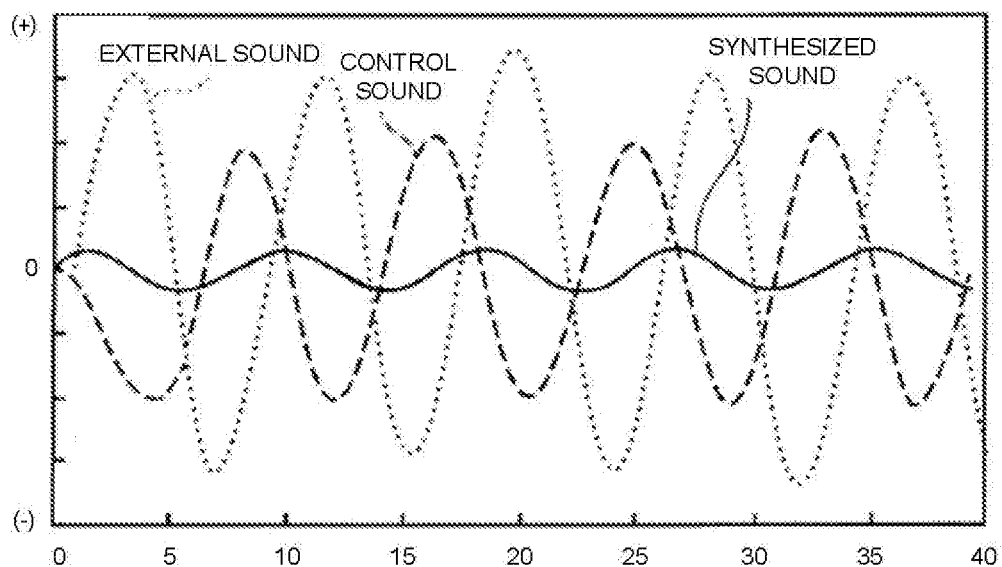

At time T2 at which the delay time d1 elapses from the time T1 at which the sound power SP reaches the threshold value TH, the control indexes CI(low) and CI(high) reach the upper limit value (+1), and as exemplified in FIG. 11A and FIG. 11B, both the sound signal (dotted line) focusing on the wind noise passing through the low pass filters 151 and 161 and the sound signal (dotted line) relating to the noise focusing on the road noise, the engine noise and the exhaust noise passing through the high pass filters 152 and 162 are subjected to phase inversion, amplified by the maximum amplification factor (digital gain) and emitted as the greatest cancel sound from the speakers 106 and 107. The external sound (solid line) relating to the noise focusing on the road noise, the engine noise and the exhaust noise is maximally attenuated by the sound of the reverse phase emitted from the speakers 106 and 107 (refer to FIG. 12A and FIG. 12B.

Once reaching the upper limit value (+1), the control indexes CI(low) and CI(high) are maintained at the Upper limit value (+1) as it is as long as the sound power SP exceeds the threshold value TH even if changed somewhat, in other words, until the sound power SP is smaller than the threshold value TH. In other words, in the constant speed travelling state in a high-speed region after speed-up, even if the speed is somewhat changed during the travelling, the greatest sound attenuation effect is exerted continuously.

If the motorcycle starts to decelerate, the sound power SP is slowly reduced. At time T3 at which it is determined that the sound power SP is equal to or smaller than the threshold value TH (FIG. 8), the control index CI(high) is subtracted by the predetermined decrement ΔDhigh, and while the sound power SP is equal to or smaller than the threshold value TH, the subtraction processing is repeated. In this way, the amplification factors of the digital amplifiers 155, 156, 165 and 166 are reduced depending on the decrease in the absolute values of the control indexes CI(low) and CI(high), and accordingly, the sound attenuation effect is reduced.

When the control index CI(high) relating to the high frequency component is converted to the value smaller than the zero value, the processing on the sound signal is switched from the phase inversion processing to the phase non-inversion processing by the phase control sections 153, 154, 163 and 164, and in this way, the sound enhancement function is started. At this time, the control index CI(low) relating to the low frequency component is set to the initial value "−0.1" (Step S22 in FIG. 7), the processing is switched from the phase inversion processing to the phase non-inversion processing, and the function is switched from the sound attenuation function to the sound enhancement function.

As the absolute value of the decrement ΔDhigh is set to the higher value than the absolute value of the increment ΔIhigh in the increasing process of noise, the delay time d2 from the time T3 at which the sound power SP is reduced to the threshold value TH to time T4 at which the control index CI(high) returns to the initial value (lower limit value) is shorter than the delay time d1 until the control index CI(high) reaches the upper limit value (+1) in the increasing process of noise. In this way, a conversion speed from the sound attenuation operation state to the sound enhancement operation state is faster than that from the sound enhancement operation state to the sound attenuation operation state in the increasing process of noise, and the environment at the early stage which includes the vicinal noise and under which the sound can be excellently caught can be returned, and the occupant can recognize the security in the vicinity from the sound situation.

In this way, according to the present embodiment, the noise attenuation and the voice conversation support both can be realized by switching the sound attenuation function and the sound enhancement function in response to the sound power of a noise band such as the engine noise and the like. Furthermore, the sound enhancement degree can be adjusted separately in the two systems of the low frequency component and the high frequency component, and in this way, the enhancement of the noise of the low frequency band is lowly suppressed, and meanwhile, the voice of the high frequency band is strongly enhanced, and in security, under the circumstances that the noise of the low frequency is heard, the conversation can be realized with natural volume.

Figure 13:
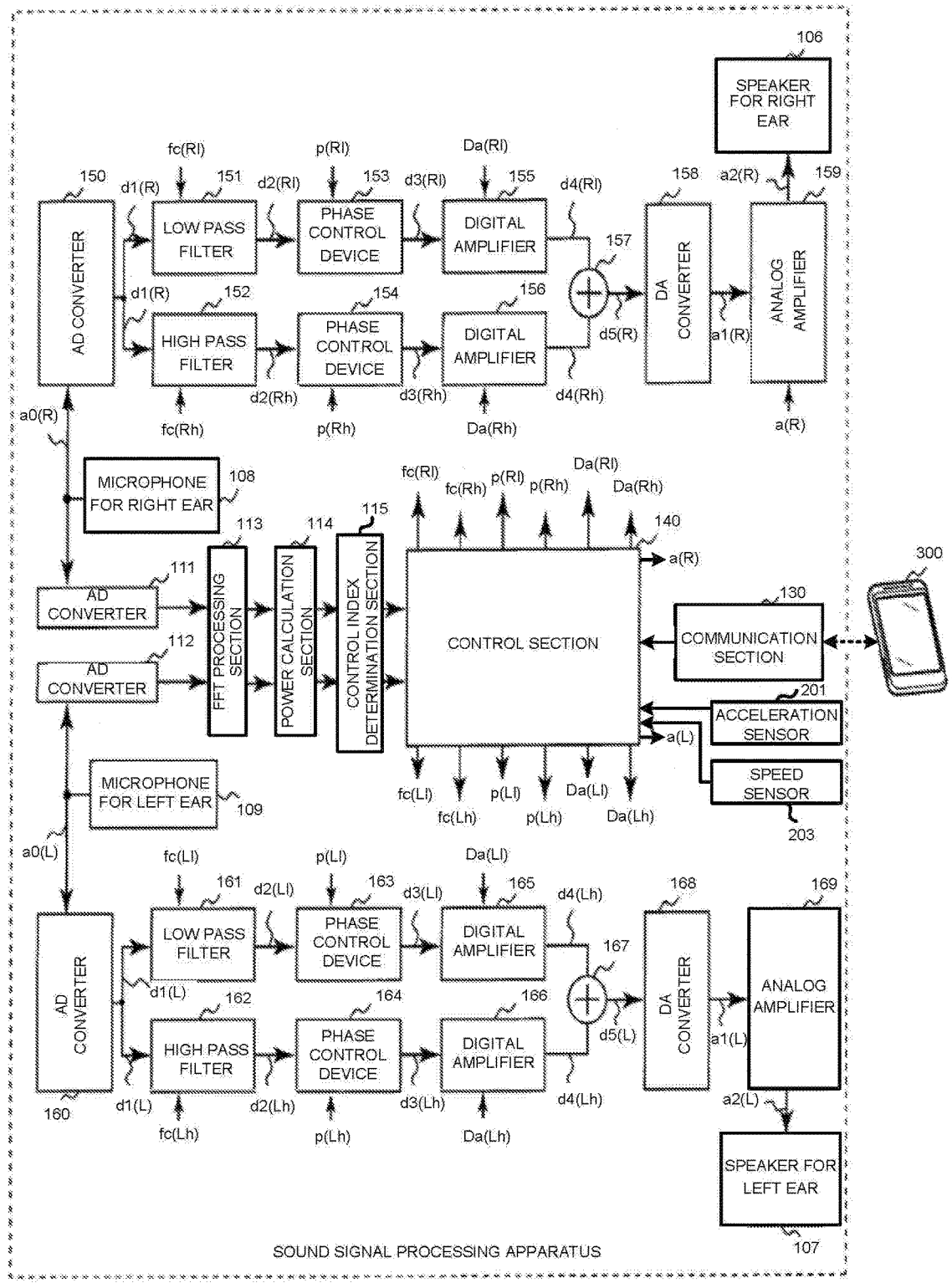
FIG. 13 is a block diagram illustrating the configuration of a sound signal processing apparatus according to a modification of the present embodiment.

FIG. 13 illustrates the configuration of a sound signal processing apparatus according to a modification of the present embodiment. The sound signal processing apparatus according to the modification is equipped with an acceleration sensor 201 and a speed sensor 203. The acceleration sensor 201 and the speed sensor 203 are built in the apparatus main body 101. In the foregoing description, the control section 140 determines the control indexes CI(low) and CI(high) based on the sound power; however, in the present modification, the control section 140 may determine the control indexes CI(low) and CI(high) based on acceleration detected by the acceleration sensor 201 and a speed detected by the speed sensor 203 in addition to the sound power. Each travelling state of the stop (zero speed), the low-speed travelling (for example, 10 km/h or less), the speed-up, the high-speed travelling (for example, 60 km/h or more) and the speed-down can be identified from the acceleration and the speed. Certainly, these travelling states can be identified from the single acceleration; however, as the identification accuracy is improved by using the acceleration and the speed together, herein, the travelling state is identified by using the acceleration and the speed together. The control section 140 determines the stop, the low-speed travelling and the high-speed travelling based on the speed and determines the speed-up and the speed-down based on the acceleration.

In the above, the control index CI(high) is incremented by the increment ΔIhigh when the sound power exceeds the threshold value TH, and is decremented by the decrement ΔDhigh when the sound power is equal to or smaller than the threshold value TH. In the present modification, the control indexes CI(low) and CI(high) are determined by using a comparative result of the sound power and the threshold value TH and a determination result of the travelling state. For example, when it is determined that the travelling state is the high-speed travelling at a speed equal to or greater than a predetermined speed such as 80 km/h, by setting the control indexes CI(low) and CI(high) to the upper limit value (+1) immediately, the greatest sound attenuation effect can be exerted immediately even when the travelling state is changed from the stop state or the low-speed travelling state to the high-speed travelling state due to the sudden speed-up in a short time. On the contrary, when it is determined that the travelling state is the stop state or the low-speed travelling at a speed smaller than a predetermined speed such as 20 km/h due to the sudden speed-down from the high-speed travelling state in a short time, by setting the band of the voice conversation, that is, the control index CI(high) relating to the high frequency component to the initial values (−1.0) immediately, the greatest sound enhancement effect can be exerted immediately even when the travelling state is changed from the high-speed travelling state to the stop state or the low-speed travelling state due to the sudden speed-down in a short time. When an absolute value of the acceleration exceeds a predetermined value at the time of the speed-up and the speed-down, the increment ΔIhigh and the decrement ΔDhigh themselves may be replaced with high values, and in this case, the control index CI(high) can be displaced to the upper limit value (+1) or the lower limit value (−1) in a short time.

The control indexes CI(low) and CI(high) may be updated according to the travelling state determined based on the acceleration detected by the acceleration sensor 201 and the speed detected by the speed sensor 203 instead of the sound power. When the detected speed is equal to or smaller than the predetermined speed such as 20 km/h, it is determined that the travelling state is the stop state or the low-speed travelling state, and the control indexes CI(low) and CI(high) are updated to the initial values. When the detected speed is equal to or greater than the predetermined speed such as 80 km/h, it is determined that the travelling state is the high-speed travelling state, and the control indexes CI(low) and CI(high) are updated to the upper limit value (+1). Further, when the acceleration exceeds the predetermined value, the control index CI(high) is incremented by the increment ΔIhigh or decremented by the decrement ΔDhigh.

Further, the sound power, the acceleration and the speed are standardized respectively, and the control indexes CI(low) and CI(high) may be updated based on values obtained by weighting and adding the standardized sound power, acceleration and speed with any coefficient.

In the above, it is described that the sound signal processing is separately controlled by the two systems of the high frequency band and the low frequency band; however, the sound signal processing may be separately controlled by three systems, and furthermore, four systems or more by adding a medium frequency band in the high frequency band and the low frequency band. In this case, in addition to the high pass filter and the low pass filter, a band pass filter is equipped, and a phase control section and a digital amplifier are equipped for each.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A helmet, comprising:
   a helmet main body configured to cover the head of a wearer;
   a speaker arranged nearby an ear of the wearer and at the inside of the helmet main body;
   a microphone arranged on the helmet main body;
   a high pass filter configured to execute a high-pass processing on a sound signal of an external sound detected by the microphone;
   a low pass filter configured to execute a low-pass processing on the sound signal;
   a first phase control section configured to control a phase of a sound signal subjected to the high-pass processing;
   a second phase control section configured to control a phase of a sound signal subjected to the low-pass processing;

a first amplification section configured to amplify a sound signal phase controlled by the first phase control section;

a second amplification section configured to amplify a sound signal phase controlled by the second phase control section;

a synthesis section configured to synthesize sound signals amplified by the first and second amplification sections to generate a synthesized sound signal;

a drive section configured to drive the speaker according to the synthesized sound signal; and a control section configured to control the first and second phase control sections and the first and second amplification sections to switch phase inversion processing/non-inversion processing on the sound signal subjected to the high-pass processing, switch phase inversion processing/non-inversion processing on the sound signal subjected to the low-pass processing, change an amplification factor for the sound signal subjected to the phase control by the first phase control section and change an amplification factor for the sound signal subjected to the phase control by the second phase control section according to sound power on at least a portion of a band of the sound signal of the external sound.

2. The helmet according to claim 1, further comprising:
a control index determination section configured to determine a first control index for a high frequency band and a second control index for a low frequency band based on the sound power, wherein
the first and second control indexes are determined as values in a predetermined range,
the first and second phase control sections are set to the phase inversion processing when the first and second control indexes indicate any values in a range from a median of the predetermined range to a maximum value, and are set to the non-inversion processing when the first and second control indexes indicate any values in a range from the median to a primary value,
the first and second amplification sections are set to a minimum amplification factor when the first and second control indexes indicate the median, and are set to a maximum amplification factor when the first and second control indexes indicate the maximum value or the minimum value, and
the setting of the phase inversion processing and the maximum amplification factor indicates a greatest sound attenuation characteristic, and the setting of the phase non-inversion processing and the maximum amplification factor indicates a greatest sound boost characteristic.

3. The helmet according to claim 2, wherein
the control index determination section provides the minimum value as an initial value of the first control index, adds a first increment to the first control index when the sound power exceeds a predetermined threshold value and subtracts a first decrement greater than the first increment from the first control index when the sound power is equal to or smaller than the threshold value so that a conversion speed from the sound attenuation characteristic to the sound boost characteristic is faster than that from the sound boost characteristic to the sound attenuation characteristic.

4. The helmet according to claim 3, wherein
the control index determination section provides the median or a neighboring value of the median as an initial value of the second control index, maintains the second control index at the initial value when the first control index is equal to or smaller than the median, and provides the same value as the first control index for the second control index when the first control index exceeds the median.

5. The helmet according to claim 4, wherein
the control index determination section maintains the first control index at the initial value as it is until the sound power exceeds the threshold value when the first control index is set to the initial value, and maintains the first control index at the maximum value as it is until the sound power is equal to or smaller than the threshold value when the first control index is set to the maximum value.

6. The helmet according to claim 2, wherein
at least one of an acceleration sensor and a speed sensor is arranged on the helmet main body, and
the control index determination section determines the first control index and the second control index based on at least one of acceleration detected by the acceleration sensor and a speed detected by the speed sensor in addition to the sound power.

7. The helmet according to claim 1, wherein
the microphone is arranged at a bottom edge of the helmet main body or at a position in the vicinity of the bottom edge.

8. The helmet according to claim 1, wherein
a cutoff frequency of the high pass filter is higher than 1.3 kHz, and a cutoff frequency of the low pass filter is lower than 1.3 kHz.

9. The helmet according to claim 1, wherein
the sound power is calculated by taking a band component of 3 kHz to 4 kHz of the sound signal of the external sound as an object.

10. The helmet according to claim 1, wherein
the sound power is calculated by taking a band component of 5 kHz or less of the sound signal of the external sound as an object.

11. A helmet, comprising:
a helmet main body configured to cover the head of a wearer;
a speaker arranged nearby an ear of the wearer and at the inside of the helmet main body;
a microphone arranged on the helmet main body;
a sensor arranged in the helmet main body configured to detect acceleration or a speed;
a high pass filter configured to execute a high-pass processing on a sound signal of an external sound detected by the microphone;
a low pass filter configured to execute a low-pass processing on the sound signal;
a first phase control section configured to control a phase of a sound signal subjected to the high-pass processing;
a second phase control section configured to control a phase of a sound signal subjected to the low-pass processing;
a first amplification section configured to amplify a sound signal receiving phase control by the first phase control section;
a second amplification section configured to amplify a sound signal receiving phase control by the second phase control section;
a synthesis section configured to synthesize sound signals amplified by the first and second amplification sections to generate a synthesized sound signal;
a drive section configured to drive the speaker according to the synthesized sound signal; and a control section configured to control the first and second phase control sections and the first and second amplification sections to switch phase inversion processing/non-inversion processing on the sound signal subjected to the high-pass processing, switch phase inversion processing/non-inversion processing on the sound signal subjected to the low-pass processing, change an amplification factor for the sound signal subjected to the phase control by the first phase control section and change an amplification factor for the sound signal subjected to the phase control by the second phase control section according to a detection value of the sensor.

12. A sound signal processing apparatus, comprising:

a speaker;

a microphone;

a high pass filter configured to execute a high-pass processing on a sound signal of an external sound detected by the microphone;

a low pass filter configured to execute a low-pass processing on the sound signal;

a first phase control section configured to control a phase of a sound signal subjected to the high-pass processing;

a second phase control section configured to control a phase of a sound signal subjected to the low-pass processing;

a first amplification section configured to amplify a sound signal receiving phase control by the first phase control section;

a second amplification section configured to amplify a sound signal receiving phase control by the second phase control section;

a synthesis section configured to synthesize sound signals amplified by the first and second amplification sections to generate a synthesized sound signal;

a drive section configured to drive the speaker according to the synthesized sound signal; and a control section configured to control the first and second phase control sections and the first and second amplification sections to switch phase inversion processing/non-inversion processing on the sound signal subjected to the high-pass processing, switch phase inversion processing/non-inversion processing on the sound signal subjected to the low-pass processing, change an amplification factor for the sound signal subjected to the phase control by the first phase control section and change an amplification factor for the sound signal subjected to the phase control by the second phase control section according to sound power of a band of at least a part of the sound signal of the external sound.

* * * * *